United States Patent [19]
Takayama et al.

[11] Patent Number: 6,100,860
[45] Date of Patent: Aug. 8, 2000

[54] IMAGE DISPLAY DEVICE

[75] Inventors: Ichiro Takayama; Kazushi Sugiura; Yukio Yamauchi; Naoya Sakamoto, all of Kanagawa; Mitsufumi Codama, Ibaraki; Michio Arai, Tokyo, all of Japan

[73] Assignees: TDK Corporation, Tokyo; Semiconductor Energy Laboratory Co., Ltd., Kanagawa, both of Japan

[21] Appl. No.: 09/071,161

[22] Filed: May 4, 1998

[30] Foreign Application Priority Data

May 16, 1997 [JP] Japan .................................. 9-126591

[51] Int. Cl.[7] ...................................................... G09G 3/30
[52] U.S. Cl. .............................. 345/76; 345/79; 345/205; 345/206
[58] Field of Search .............................. 345/79, 205, 206, 345/76

[56] References Cited

U.S. PATENT DOCUMENTS

| | | | |
|---|---|---|---|
| 4,237,456 | 12/1980 | Kanatani | 345/76 |
| 4,406,997 | 9/1983 | Depp et al. | 345/205 |
| 4,621,260 | 11/1986 | Suzuki et al. | 345/206 |
| 5,550,066 | 8/1996 | Tang et al. | 345/205 |
| 5,786,796 | 6/1998 | Takayama et al. | 345/76 |
| 5,926,160 | 6/1998 | Furuya | 345/205 |

FOREIGN PATENT DOCUMENTS

| | | | |
|---|---|---|---|
| 0 653 741 A1 | 5/1995 | European Pat. Off. | 345/205 |
| 0 762 374 A1 | 3/1997 | European Pat. Off. | 345/205 |

OTHER PUBLICATIONS

"A 6×6–in 20–lpi Electroluminescent Display Panel", Brody et al, *IEEE Transaction on Electron Devices*, vol. ED–22, No. 9, Sep. 1975, pp. 739–745.

*Primary Examiner*—Richard A. Hjerpe
*Assistant Examiner*—Ali A. Zamani
*Attorney, Agent, or Firm*—Arent Fox Kintner Plotkin & Kahn PLLC

[57] ABSTRACT

An image display device having a plurality of pixcels with uniform light intensity comprises an organic EL element (3), a bias FET (2) for emit current control of said EL element, a capacitor (4) coupled with a gate electrode of said bias FET (2) for holding a signal, and a select FET (1) for selectively writing a signal to said capacitor (4), wherein the value S of said bias FET (2) is larger than that of said select FET (1).

10 Claims, 10 Drawing Sheets

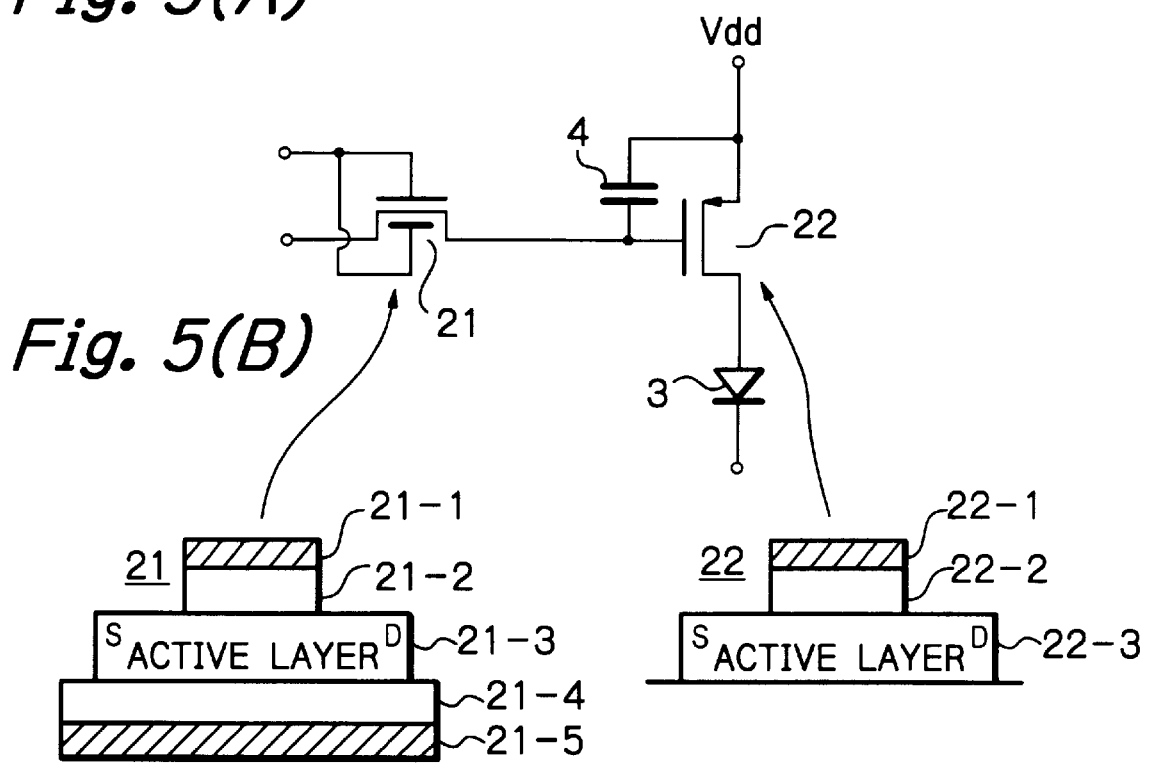

IMAGE DISPLAY DEVICE

BACKGROUND OF THE INVENTION

The present invention relates to an image display device, in particular, relates to a high quality image display device suitable to an organic electronics luminescence (EL) display device.

An image display device using an organic EL element has lately been developed. When an organic EL display device using a plurality of organic EL elements is activated by using an active matrix circuit, each pixcel, or image cell, of an EL is coupled with a field effect transistor (FET) implemented by a thin film transistor (TFT) for controlling current supplied to said pixcel.

FIG. 9 shows a circuit diagram of a prior active matrix type Organic EL display system. The system has a plurality of X-direction signal lines 301-1, 301-2, et al, a plurality of Y-direction signal lines 302-1, 302-2, et al, a plurality of power supply lines (Vdd) 303-1, 303-2, et al, a plurality of switching FET's (select FET) 304-1, 304-2, et al, a plurality of current control FET's (bias FET) 305-1, 305-2, et al, a plurality of organic EL elements 306-1, 306-2 et al, a plurality of capacitors 307-1, 307-2, et al, an X-direction drive circuit 308, and a Y-direction drive circuit 309.

A pixcel to be bright is selected by one of the X-direction signal lines 301, and one of the Y-direction signal lines 302, and a switch FET's (select FET) 304 associated with the selected pixcel is turned ON and the capacitor 307 associated with the selected pixcel is charged. Then, the current control FET (bias FET) 305 associated with the selected pixcel is turned ON, and then, the organic EL element 306 associated with the selected pixcel is supplied current through the power supply line 303 according to the image data to be displayed. Thus, the selected EL element emits light.

For instance, when the X-direction signal line 301-1 receive a signal relating to an image data to be displayed, and the Y-direction signal line 302-1 receives a Y-direction scanning signal, the switch FET (select FET) 304 which is selected by the lines 301-1 and 302-1 is turned ON. Then, the current control FET (bias FET) 305-1 is turned ON according to the image data to be displayed, and the current relating to the image to be displayed flows in the organic EL element 306-1, which then emits light.

The light intensity emitted by an EL element in an active matrix type EL image displace system depends upon the current flowing in a current control FET (bias FET), and said current depends upon charge stored in a capacitor which stores signal. This operation is described in A66-in 201pi Electoluminescent Display Panel T. P. Brody, F. C. Luo, et al, IEEE Trans. Electron Devices, Vol.ED-22, No.9, September 1975, pages 739–749.

As described above, the intensity of each pixcel depends upon the current supply capability of a current control FET 305 (bias FET), and voltage stored in a capacitor 307.

The disadvantage of a prior display system thus described is that the light intensity is not uniform and the image quality is degraded, because the current supply capability of the current supply FET's (bias FET) is not uniform.

When gate voltage $V_{GS}$ applied to a gate electrode of an FET is gradually increased from the lower voltage than $V_0$ shown in FIG. 10A, the source-drain current $I_{DS}$ increases suddenly when the gate voltage exceeds said voltage $V_0$. The value $V_0$ is defined to be the gate voltage at which the source-drain current begins to flow. The gate voltage which provides ten times of current is defined as the parameter S (V/decade). In practice, the parameter S is defined by the gradient of the curve of the source-drain current and the gate voltage. The parameter S is the minimum around the threshold $V_{th}$ which provides a channel. The minimum value of the parameter S is called the value S of an FET as shown in FIG. 10B. The smaller the value S is, the larger the increase of source-drain current $I_{DS}$ is.

The threshold of an FET is not uniform but dispersed for each elements due to contamination and/or lattice defect. Because of the dispersion, the current depends upon each element even for the uniform gate voltage, and the effect of the dispersion is large when the gate voltage is close to the threshold where the value S is small and the gradient of the current is large.

FIG. 10C shows the experimental result of the dispersion. We produced many FET's each of which has an upper gate electrode 100-1, a lower gate electrode 100-5, an upper gate oxide layer 100-2, an active layer 100-3, and a lower gate oxide layer 100-4. The lower gate electrode 100-5 is fixed to the source voltage. The control voltage 0–10 V is applied to the upper gate electrode 100-1, and the source-drain current is measured. The average $A_{ve}$ of $I_{DS}$ for each control voltage $V_g$, and the standard deviation ($\alpha$) is obtained. The solid curve in FIG. 10C shows the ratio $(\alpha)/A_{ve}$ for each control voltage $V_g$.

Similarly, when an upper gate electrode is fixed to source voltage, and control voltage 0–17 V is applied to a lower gate electrode, the dotted curve in FIG. 10C shows the similar relation between the control voltage $V_g$ and the ratio $(\alpha)/V_{av}$ for each control voltage.

It should be noted in FIG. 10C that the characteristics of an FET disperses much even if the structure is the same, and the deviation or the dispersion is the maximum for the specific control voltage. The control voltage $V_g$ which provides the maximum deviation is the same as the gate voltage which gives the value S, and is close to the threshold.

As described above, a prior active matrix type organic EL display element has the disadvantages that the dispersion of the characteristics when gate voltage is close to threshold is large, and the dispersion of display intensity is large in particular when image is dark.

SUMMARY OF THE INVENTION

It is an object of the present invention to overcome the disadvantages and limitations of a prior image display device by providing a new and improved image display device.

It is also an object of the present invention to provide an image display device having uniform light intensity.

The above and other objects are attained by an image display device comprising; an organic EL element; a bias FET for light current control of said organic EL element; a capacitor for holding signal coupled with a gate electrode of said bias FET for light control; a select FET for writing signal to said capacitor; wherein the value S of said bias FET is larger than that of said select FET.

BRIEF DESCRIPTION OF THE DRAWINGS

The forgoing and other objects, features and attendant advantages will be appreciated as the same become better understood by means of the following description and accompanying drawings wherein;

FIGS. 5(A) and 5(B) show a circuit and the structure of an FET of the fourth embodiment of the present invention.

DESCRIPTION OF THE PREFERRED EMBODIMENTS (First embodiment)

The first embodiment of the present invention is described in accordance with FIG. 2. In the first embodiment, the thickness of a gate oxide layer of a current control FET (bias FET) for light emission is larger than the thickness of a gate oxide layer of a switching FET (select FET) for writing data in a capacitor, so that the value S of a bias FET is larger than the value S of a select FET.

Figure 1:
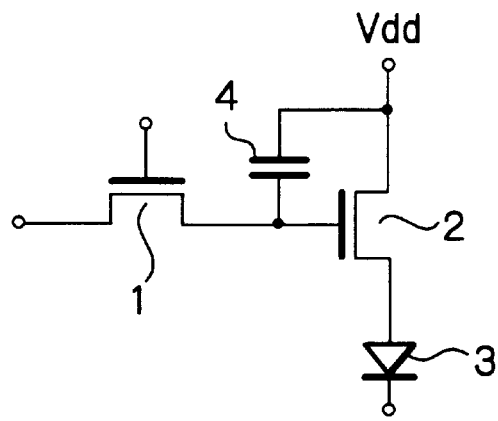
FIG. 1 is a circuit diagram of an image display system according to the present invention.
Figure 2A:
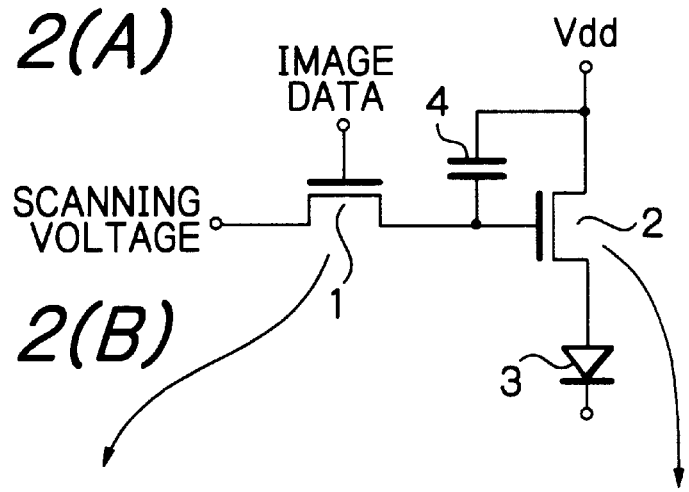
FIG. 2(A) and 2(B) show a circuit and the structure of an FET of the first embodiment of the present invention.

FIG. 2A shows a circuit diagram of an image display systems for one pixcel, having a switching FET (field effect transistor) 1 for writing data to a capacitor, a current control FET 2 for controlling current in an organic EL element 3, an organic EL element 3 for one pixcel of an image display system, and a capacitor 4 for holding a signal. An FET 1 for switching or writing data to a capacitor is called a select FET, and an FET 2 for light current control is called a bias FET.

Figure 9:
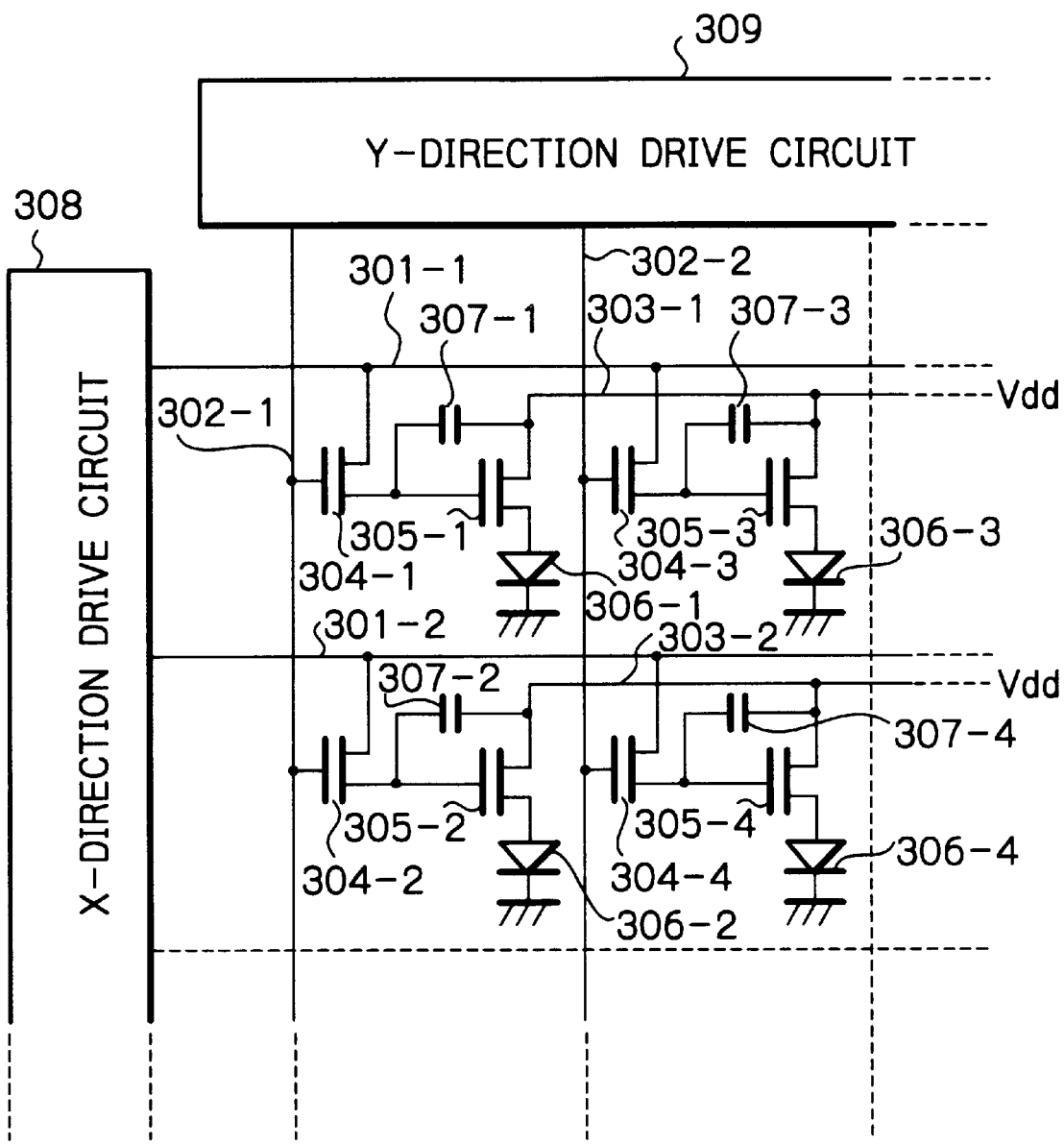
FIG. 9 shows a circuit diagram of a prior image display system.
Figure 10A:
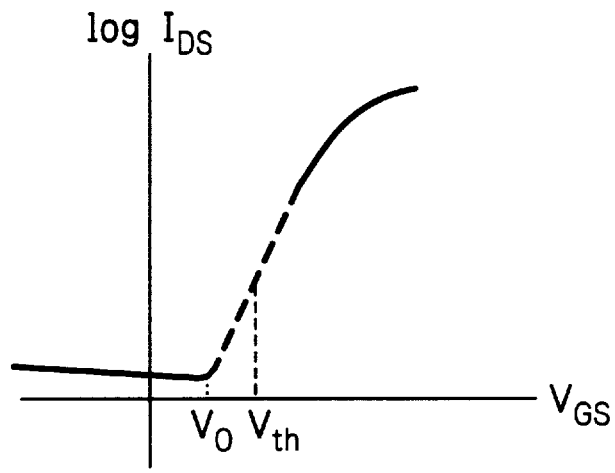
FIGS. 10(A), 10(B) and 10(C) show characteristic curves of a prior FET display element.
Figure 10B:
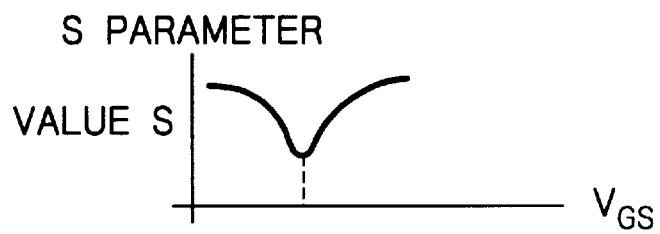
Figure 10C:
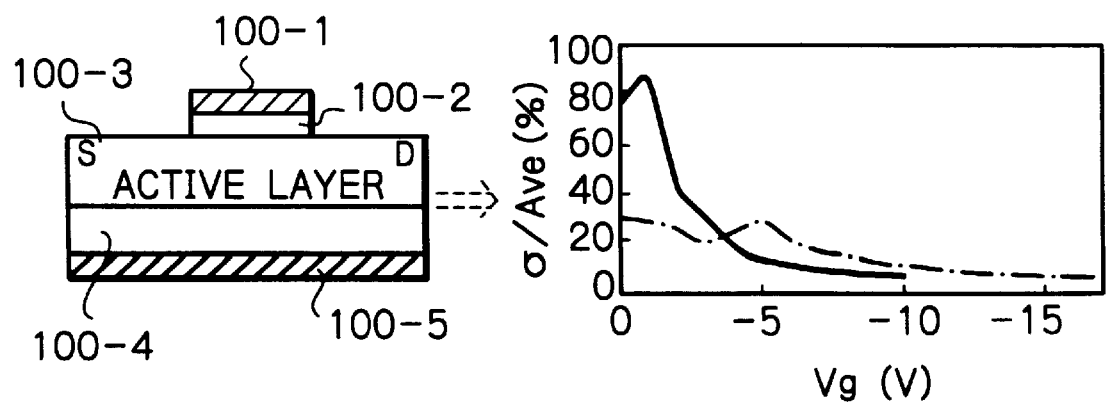

The switching FET 1 or select FET 1 corresponds to a switching FET 304 in FIG. 9. The select FET 1 receives scanning voltage from Y-direction drive circuit (not shown) to a drain-source circuit, and an image data signal from X-direction drive circuit (not shown) to a gate electrode. When the select FET 1 is turned ON by the scanning voltage and the image data, an output signal which depends upon an image data signal is held in the capacitor 4.

The bias FET 2 controls the current in an organic EL element 3 according to the image data signal held in the capacitor 4, so that the light emission of the organic EL element 3 is controlled by the image data signal.

Figure 2B:

FIG. 2B shows the structure of each FET. According to the first embodiment, the select FET 1 comprises a gate electrode 1-1, a gate oxide layer 1-2, and an active layer 1-3. Similarly, the bias FET 2 comprises a gate electrode 2-1, a gate oxide layer 2-2, and an active layer 2-3 in which a source region S and a drain region D are provided. The feature in FIG. 2 is that the thickness of the gate oxide layer 2-2 of the light control or bias FET 2 is larger than the thickness of the gate oxide layer 1-2 of the data writing or select FET 1.

When the gate oxide layer 2-2 of the bias FET 2 is thick, the change of source-drain current $I_{DS}$ in the bias FET 2 is smaller when the gate voltage $V_{GS}$ changes than that when the gate oxide layer 2-2 is thin. In other words, when the gate oxide layer is thick, the sensitivity of an FET is low, and high gate voltage $V_{GS}$ is requested for the change of source-drain current.

By the way, the characteristics of an FET is dispersed for each element because of contamination and/or lattice defect. Because of the dispersion, the current for specific gate voltage depends upon each element. The dispersion of the current is the largest when the gate voltage is close to the threshold. The dispersion of the characteristics provides an undesirable static and random nonuniformity of intensity, and/or degradation of picture quality.

If we wish to get rid of degradation of picture quality, the current change due to the change of gate voltage must be small so that ununiformity of output current is small, in other words, an FET having the large value S must be used as a bias FET.

However, an FET with the large value S has the disadvantage that the source-drain current is small for a given gate voltage which depends upon source voltage. Therefore, if we use such an FET as a select FET, it would be impossible to hold enough charge in a capacitor in a short time. That disadvantage is serious in a high resolution image display system which is scanned quickly, and in that case a picture would be vague.

The present invention solved that problem by using a select FET with the small value S, and a bias FET with the large value S. Thus, high quality image display system is obtained.

Thus, according to the first embodiment of the present invention, the gate oxide layer 2-2 of a bias FET 2 is thick so that the value S is large, and simultaneously, the thickness of the gate oxide layer 1-2 of a select FET 1 smaller than that of a bias FET 2 so that the value S is small and large current flows for charging a capacitor 4 with image data in a short time.

Therefore, a high quality image display system is obtained by keeping the value S of a select FET small, and the value S of a bias FET large.

When the size of a screen is fixed, the higher the resolving power of an image display system is, the smaller the area of each thin film organic EL element is. Therefore, even when the source-drain current of a bias FET which has the large value S for a gate voltage which depends upon a sources voltage is small, that source-drain current is enough for the desirable operation of a select FET.

Each FET in the above description may be of course implemented by a thin film transistor TFT.

Figure 11:
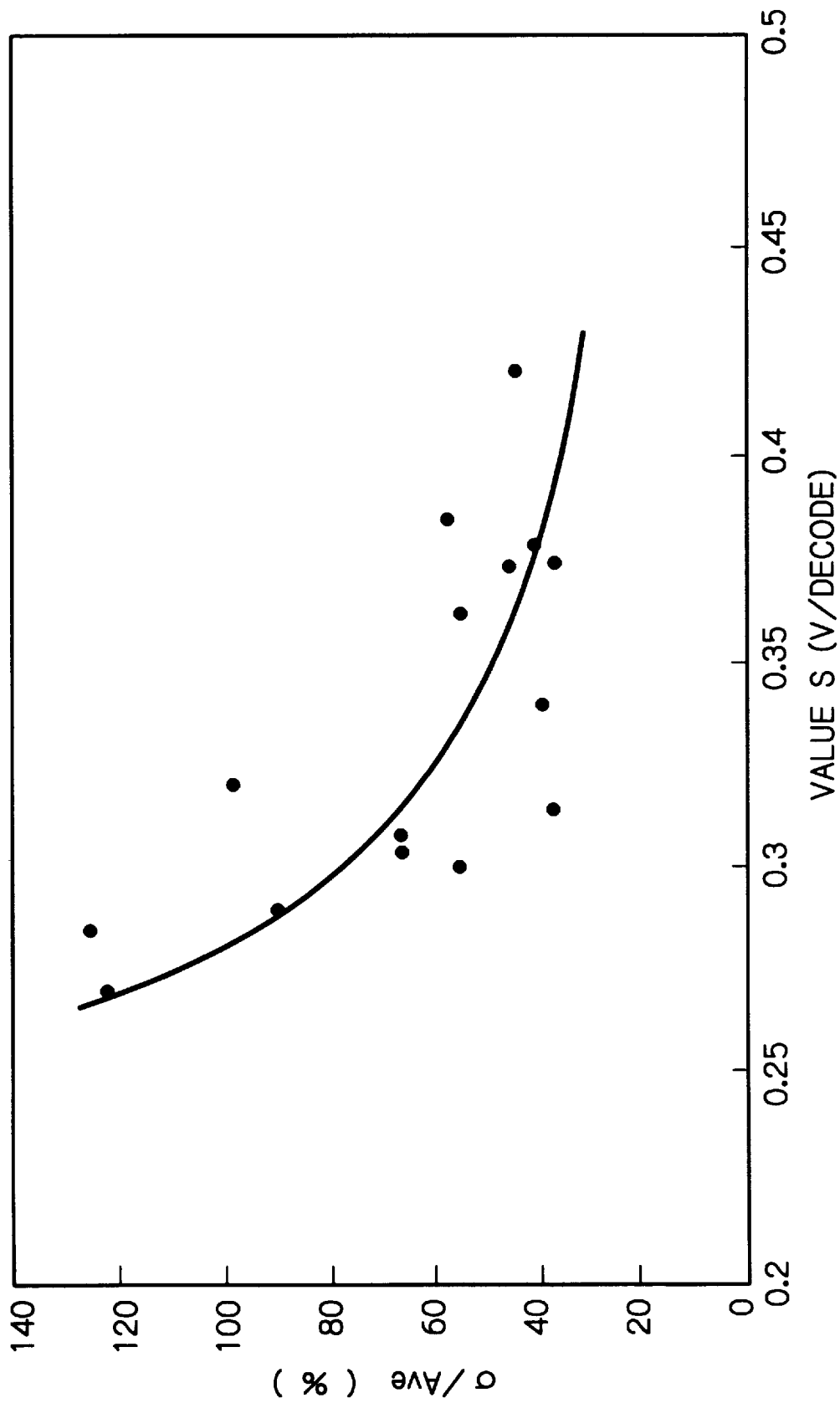
FIG. 11 shows an experimental curve between the value S and the deviation of drain-source current of an FET.

FIG. 11 shows an experimental curve between the value S and the dispersion of drain-source current $I_{DS}$ in the form of $(\alpha)/A_{ve}$ (%) of an FET, where $(\alpha)$ is standard deviation of $I_{DS}$ and $A_{ve}$ is average value of $I_{DS}$. It should be noted in FIG. 11 that if the value S is smaller than 0.35 V/decade, the dispersion increases rapidly. Therefore, it is preferable that the value S of a bias FET is larger than 0.35, and the value S of a select FET is smaller than that value.

(Second embodiment)

The second embodiment of the present invention is described in accordance with FIG. 3. The second embodiment is directed to a thin film transistor (TFT) having an upper gate electrode 11-1(12-1), and a lower gate electrode 11-5(12-5).

Figure 3A:
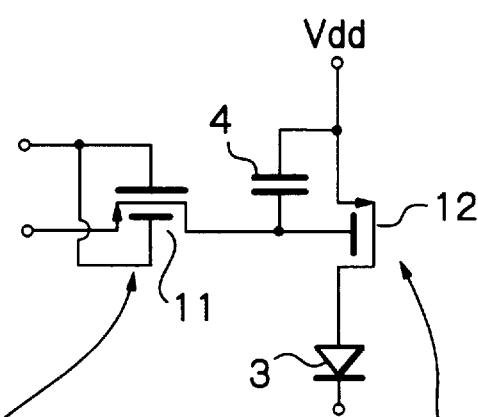
FIGS. 3(A) and 3(B) show a circuit and the structure of an FET of the second embodiment of the present invention.
Figure 3B:
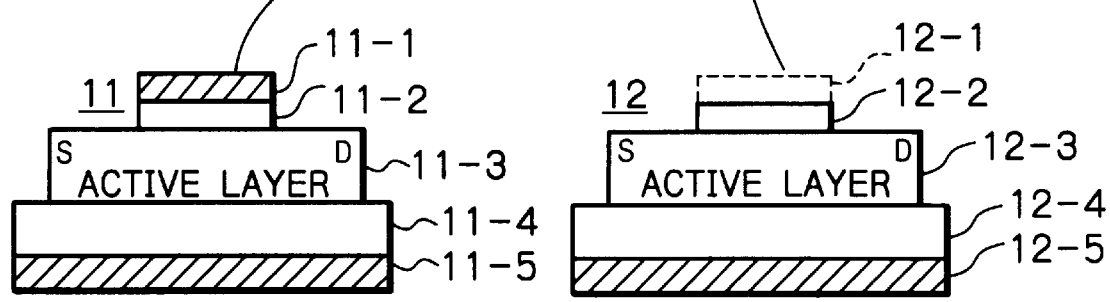

FIG. 3A is a circuit diagram of one pixcel of an image display system, and FIG. 3B shows structure of each TFT.

In the second embodiment, the TFT 11 functions as a select FET, and the TFT 12 functions as a bias FET.

The select TFT 11 comprises an upper gate electrode 11-1, an upper gate oxide layer 11-2, an active layer 11-3, a lower gate oxide layer 11-4, and a lower gate electrode 11-5. The upper gate oxide layer 11-2 is thinner than the lower gate oxide layer 11-4.

The select TFT 11 is produced as follows. A substrate is patterned with poly-silicon to form a lower gate electrode 11-5, on which a lower gate oxide layer 11-4 is deposited by forming $SiO_2$ layer by 1000 Å thickness through plasma CVD process with TEOS gas (Tetra-Ethoxy-Silane). On the lower gate oxide layer 11-4, an amorphous silicon layer is deposited through CVD process with $SiH_4$ gas, and the amorphous silicon layer is solid-developed to provide a poly-silicon layer which functions as an active layer 11-3, on which an upper gate oxide layer 11-2 of $SiO_2$ layer of 500 Å thickness is formed. Finally, an upper gate electrode 11-1 of poly-silicon layer is deposited on the upper gate oxide layer 11-2.

The select TFT 12 comprises, as shown in FIG. 3B, an upper gate electrode 12-2, an active layer 12-3, a lower gate oxide layer 12-4, and a lower gate electrode 12-5. The upper gate oxide layer 12-2 is thinner than the lower gate oxide layer 12-4, as is the case of the TFT 11.

The structure of the TFT 12 is the same as that of the TFT 11, except that the TFT 12 has no upper gate electrode 12-1. The TFT,s 11 and 12 are produced at the same time. The upper gate electrode 12-1 may be removed after both the gate electrodes 11-1 and 12-1 are produced, alternatively, only the upper gate electrode 11-1 is produced but not the upper gate electrode 12-1.

The bias TFT 12 uses the thick lower gate oxide layer 12-4, and the select TFT 11 uses the thin upper gate oxide layer 11-2, so that the value S of the bias TFT 12 is large, and the value S of the select TFT 11 is smaller than that of the TFT 12. Thus, high quality image display system is obtained.

It should be noted in FIG. 3A that the upper gate electrode 11-1 may be connected to the lower gate electrode 11-5. Since the lower gate oxide layer 11-4 is thicker than the upper gate oxide layer 11-2, the control function of the TFT 11 is essentially defined by the upper gate electrode 11-1.

(Third embodiment)

The third embodiment is described in accordance with FIG. 4. The TFT of the third embodiment has, as shown in FIG. 4, an upper gate electrode 11-1 (13-1), a lower gate electrode 11-5 (13-5), and a lower gate oxide layer (11-4 (13-4) which is made of a thick layer.

Figure 4A:
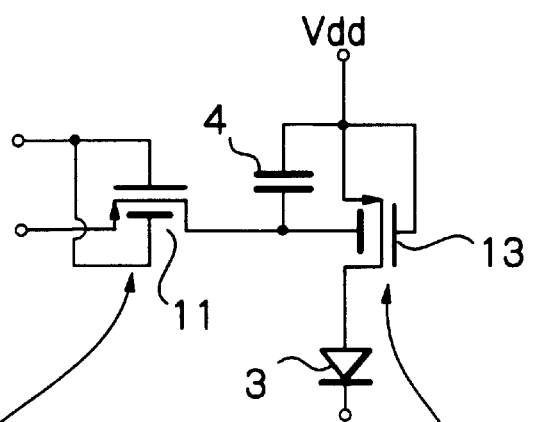
FIGS. 4(A) and 4(B) show a circuit and the structure of an FET of the third embodiment of the present invention.
Figure 4B:
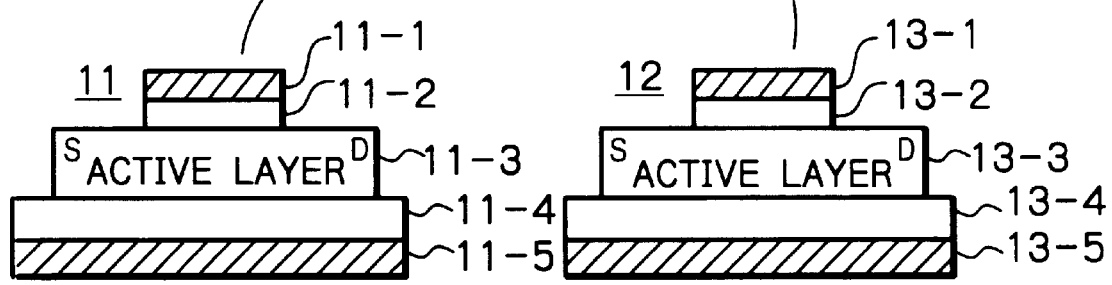

FIG. 4A shows a circuit diagram of one pixcel of an image display system, and FIG. 4B shows the structure of each TFT.

The feature of the third embodiment is that both the select TFT and the bias TFT have a thick lower gate oxide layer.

The select TFT 11 has, as shown in FIG. 4B, an upper gate electrode 11-1, an upper gate oxide layer 11-2, an active layer 11-3, a lower gate oxide layer 11-4, and a lower gate electrode 11-5. The upper gate oxide layer 11-2 is thinner than the lower gate oxide layer 11-4.

Similarly, the bias TFT 13 has, as shown in FIG. 4B, an upper gate electrode 13-1, an upper gate oxide layer 13-2, an active layer 13-3, a lower gate oxide layer 13-4, and a lower gate electrode 13-5. The upper gate oxide layer 13-2 is thinner than the lower gate oxide layer 13-4.

The structure of the TFT 11 and the TFT 13 is the same as each other, and those TFT's are produced simultaneously as follows. A substrate is patterned with poly-silicon to form lower gate electrodes 11-5 and 13-5, on which lower gate oxide layers 11-4 and 13-4 are deposited by forming $SiO_2$ layer by 1000 Å thickness through plasma CVD process with TEOS gas. On the lower gate oxide layers, an amorphous silicon layer is deposited through CVD process with $SiH_4$ gas, and the amorphous silicon layer is solid-phase developed to provide a poly-silicon layer which functions as active layers 11-3 and 13-3, on which upper gate oxide layers 11-2 and 13-2 of $SiO_2$ of 500 Å thickness are formed. Then, upper gate electrodes 11-1 and 13-1 of poly-silicon layer are deposited on the upper gate oxide layers.

As shown in FIG. 4A, the upper gate electrode 11-1 of the TFT 11 is connected to the lower gate electrode 11-5, and those gate electrodes receive the common control voltage. At that time, since the lower gate oxide layer 11-4 is thicker than the upper gate oxide layer 11-2, the control characteristics of the TFT 11 is essentially defined by the upper gate oxide layer 11-1, but not the lower gate oxide layer 11-4.

As for the TFT 13, the upper gate electrode 13-1 is coupled with the source electrode and high voltage of the power source Vdd. Since the power source voltage is fixed, the upper gate electrode has no control function. Thus, the control function of the TFT 13 is obtained by the lower gate electrode 13-5.

As described above, the value S of the bias TFT 13 is large since the thick lower gate oxide layer 13-4 is used for the control. And, the value S of the select TFT 11 is small since the thin upper gate oxide layer 11-2 is used for the control. Thus, high quality image display system is obtained.

(Fourth embodiment)

The fourth embodiment of the present invention is described in accordance with FIG. 5.

A select TFT 21 in the fourth embodiment comprises, as shown in FIG. 5B, an upper gate electrode 21-1, an upper gate oxide layer 21-2, an active layer 21-3, a lower gate oxide layer 21-4, and a lower gate electrode 21-5. The thickness of the upper gate oxide layer 21-2 is larger than the thickness of the lower gate oxide layer 21-4.

A bias TFT 22 in the fourth embodiment comprises an upper gate electrode 22-1, an upper gate oxide layer 22-2, and an active layer 22-3. No lower gate oxide layer nor lower gate oxide layer is provided in the bias TFT 22 in the fourth embodiment.

The select TFT 21 is produced as follows. A substrate is patterned with poly-silicon to form a lower gate electrode 21-5, on which a lower gate oxide layer 21-4 is deposited by forming $SiO_2$ layer by 500 Å thickness through plasma CVD process with TEOS gas. On the lower gate oxide layer 21-4, an amorphous silicon layer is deposited through CVD process with $SiH_4$ gas, and the amorphous silicon layer is solid-phase developed to provide a poly-silicon layer which functions as an active layer 21-3, on which an upper gate oxide layer 21-2 of $SiO_2$ layer 1000 Å is formed. Then, an upper gate electrode 21-1 of poly-silicon layer is deposited on the upper gate oxide layer 21-2.

As for the bias TFT 22, the active layer 22-3, the gate oxide layer 22-2, and the upper gate electrode 22-1 are produced simultaneously when the active layer 21-3, the upper gate oxide layer 21-2 and the upper gate electrode 21-1 of the TFT 21 are produced, respectively.

The upper gate electrode 21-1 of the select TFT 21 is coupled with the lower gate electrode 21-5. Since the upper gate oxide layer 21-2 is thicker than the lower gate oxide layer 21-4, the control function of the TFT 21 is defined by the lower gate electrode 21-5.

In the fourth embodiment shown in FIG. 5, the value S of the select TFT 21 is small since the thin lower gate oxide layer 21-4 is used. The value S of the bias TFT 22 is large since the thick gate oxide layer 22-2 is used. Thus, high quality image display system is obtained.

(Fifth embodiment)

The fifth embodiment is described in accordance with FIG. 6.

Figure 6A:
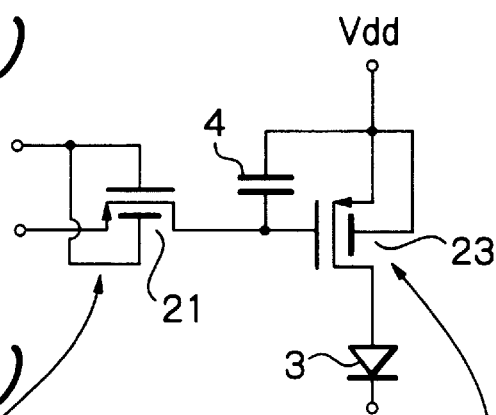
FIGS. 6(A) and 6(B) show a circuit and the structure of an FET of the fifth embodiment of the present invention.
Figure 6B:
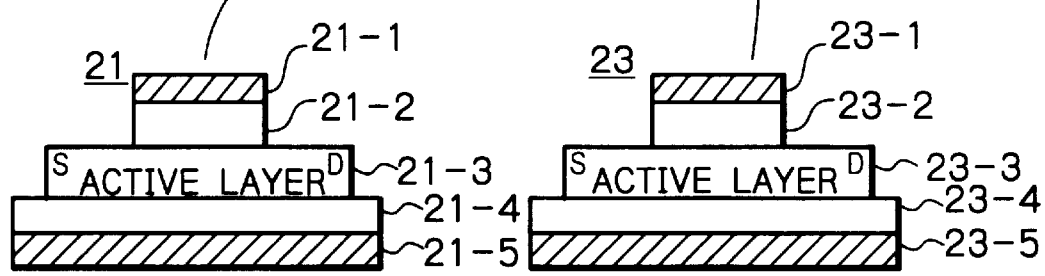

FIG. 6A is a circuit diagram of one pixcel of an image display system, and FIG. 6B shows structure of each TFT.

The select TFT 21 in FIG. 6 comprises an upper electrode 21-1, a thick upper gate oxide layer 21-2, an active layer 21-3, a thin lower gate oxide layer 21-4, and a lower gate electrode 21-5. The bias TFT 23 comprises an upper gate electrode 23-1, a thick upper gate oxide layer 23-2, an active layer 23-3, a thin lower gate oxide layer 23-4 and a lower gate electrode 23-5.

The structure of the TFT 21 is the same as the structure of the TFT 23, and those TFT's are produced simultaneously as follows.

Concerning the TFT 21, a substrate is patterned with poly-silicon to form a lower gate electrodes 21-5, on which a lower gate oxide layers 21-4 is deposited by forming $SiO_2$ layer by 500 Å thickness through plasma CVD process with TEOS gas. On the lower gate oxide layer 21-4, an amorphous silicon layer is deposited through CVD process with $SiH_4$ gas, and the amorphous silicon layer is solid-phase developed to provide a poly-silicon layer which functions as an active layer 21-3, on which an upper gate oxide layer 21-2 of $SiO_2$ layer of 1000 A thickness is formed. Then, an upper gate electrode 21-1 of poly-silicon layer is deposited on the upper gate oxide layer 21-2. The TFT 23 is produced at this same time as the TFT 21.

The upper gate electrode 21-1 of the TFT 21 is connected to the lower gate electrode 21-5 of the TFT 21, as shown in FIG. 6A. Since the upper gate oxide layer 21-2 is thicker than the lower gate oxide layer 21-4, the control function of the TFT 21 is defined by the lower gate oxide layer 21-4.

Similarly, the lower gate electrode 23-5 of the bias TFT 23 is connected to the source of the TFT 23, and the fixed power source voltage Vdd. As the power source voltage Vdd is fixed, the lower gate electrode 23-5 has no control function. Thus, the control function of the light control TFT 23 is determined by the upper gate electrode 23-1.

The value S of the select TFT 21 is small since it is defined by the thin lower gate oxide layer 21-4, and the value S of the bias TFT 23 is large since it is defined by the thick upper gate oxide layer 23-2. Thus, high quality image display system is obtained.

(Sixth embodiment)

Figures 7A, 7B:
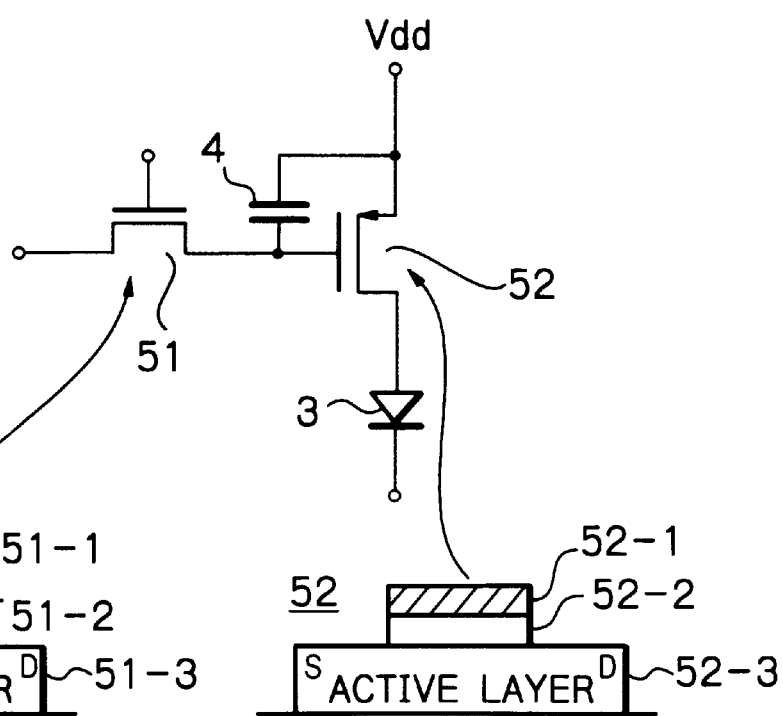
FIGS. 7(A) and 7(B) show a circuit and the structure of an FET of the sixth embodiment of the present invention.

The sixth embodiment of the present invention is described in accordance with FIG. 7. The value S of a TFT is determined by designing dielectric constant of a gate oxide layer.

In the sixth embodiment, a select TFT 51 comprises a gate electrode 51-1, a gate oxide layer 51-2, and an active layer 51-3, and a bias TFT 52 comprises a gate electrode 52-1, a gate oxide layer 52-2 and an active layer 52-3. The dielectric constant $\epsilon_{51}$ of the gate oxide layer 51-2 is larger than the dielectric constant $\epsilon_{52}$ of the gate oxide layer 52-2, so that $\epsilon_{51} > \epsilon_{52}$. Therefore, the value S of the TFT 51 is smaller than the value S of the TFT 52.

The producing steps for providing the relations $\epsilon_{51} > \epsilon_{52}$ is as follows. after the active layers 51-3 and 52-3 are produced on a substrate, a gate oxide layer 51-2 is first produced through plasma CVD process with $SiH_4$, $N_2O$ and ammonia gas. Then, a gate oxide layer 52-2 is produced through plasma CVD process with less ammonia gas. The amount of ammonia gas when the gate oxide layer 51-2 is produced is larger than that when the gate oxide layer 52-2 is produced. Then, the gate electrodes 51-1 and 52-1 are produced on the gate oxide layers 51-2 and 52-2, respectively. As the amount of ammonia gas when the gate oxide layer 51-2 of the TFT 51 is produced, is larger than the amount of ammonia gas when the gate oxide layer 52-1 of the TFT 52 is produced, the dielectric constant $\epsilon_{51}$ of the gate oxide layer 51-2 is larger than the dielectric constant $\epsilon_{52}$ of the gate oxide layer 52-2.

Thus, the value S of a bias TFT 52 is larger than the value S of a select TFT 51, and high quality image display system is obtained.

(Seventh embodiment)

Figure 8A:
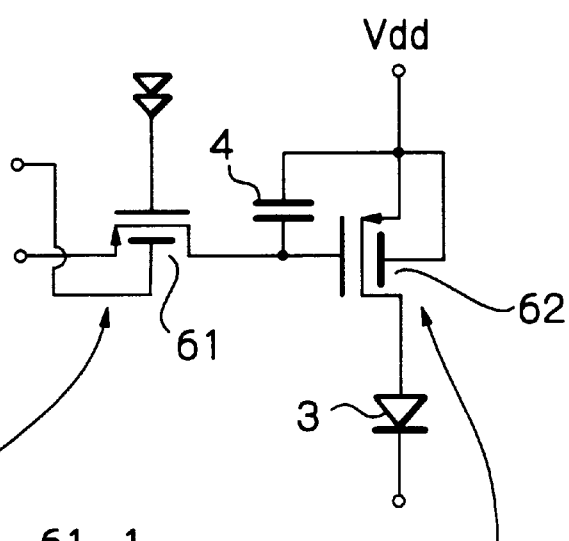
FIGS. 8(A) and 8(B) show a circuit and the structure of an FET of the seventh embodiment of the present invention.
Figure 8B:
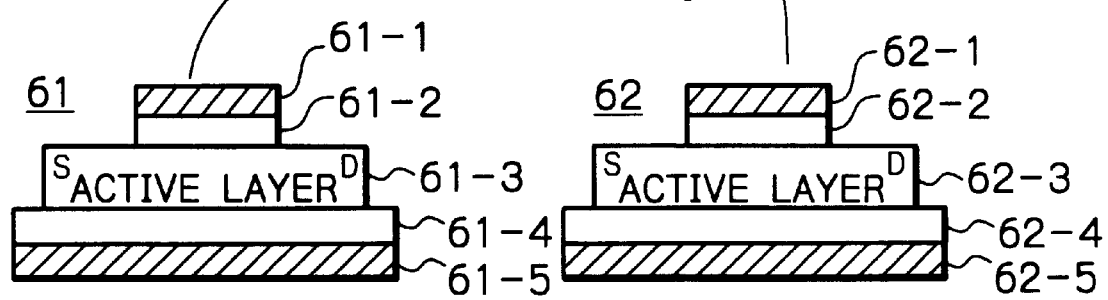

The seventh embodiment of the present invention is described in accordance with FIG. 8. The seventh embodiment has TFT's 61 and 62, each comprising an upper gate electrode 61-1 (62-1), an upper gate oxide layer 61-2 (62-2) with small dielectric constant, an active layer 61-3 (62-3), a lower gate oxide layer 61-4 (62-4) with larger dielectric constant than that of an upper gate oxide layer, and a lower gate electrode 61-5 (62-5).

In order to provide larger dielectric constant $\epsilon_4$ of a lower gate oxide layer than the dielectric constant $\epsilon_2$ of an upper oxide layer, the producing steps for a TFT are as follows.

A substrate is patterned with poly-silicon to form lower gate electrodes 61-5, and 62-5, on which lower gate oxide layers 61-4 and 62-4 are deposited through plasma CVD process with $SiH_4$, $N_2O$ and ammonia gas. On the lower gate oxide layers, an amorphous silicon layer is deposited through CVD process with $SiH_4$ gas, and the amorphous silicon layer is solid-phase developed to provide a poly-silicon layer which functions as active layers 61-3 and 62-3, on which upper gate oxide layers 61-2 and 62-2 are formed through CVD process with $SiH_4$, $N_2O$ and ammonia gas, and upper gate electrodes 61-1 and 62-2 are formed on the upper gate oxide layers. The amount of ammonia gas when the lower gate oxide layers are produced is larger than the amount of ammonia gas when the lower gate oxide layers are produced.

Since the rate of ammonia gas when the lower gate oxide layers 61-4 and 62-4 are produced is higher than that when the upper gate oxide layers 61-2 and 62-2 are produced, the dielectric constant $\epsilon_4$ of the lower gate oxide layers is larger than the dielectric constant $\epsilon_2$ of the upper gate oxide layers ($\epsilon_4 > \epsilon_2$).

The upper gate electrode 61-1 of the select TFT 61 is connected to a fixed voltage so that the upper gate electrode 61-1 does not function as a control gate, and the lower gate electrode 61-4 operates as a control gate. The lower gate electrode 62-4 of the bias TFT 62 is fixed to the source voltage Vdd so that the lower gate electrode does not function as a control gate, and the upper gate electrode 62-2 operates as a control gate. Thus, in the select TFT 61, the control is carried out by the lower gate oxide layer 61-4 which has high dielectric constant, and in the bias TFT 62, the control is carried out by the upper gate electrode 62-2 which has low dielectric constant.

Thus, the value S of a bias TFT 62 is high, and the value S of a select TFT 61 is lower than that of a bias TFT 62, and high quality image display system is obtained.

(Eighth embodiment)

The eighth embodiment is now described. Each TFT in the eighth embodiment comprises, as shown in FIG. 8, an upper gate electrode, an upper gate oxide layer, an active layer, a lower gate oxide layer and a lower gate electrode. In the eighth embodiment, the dielectric constant of an upper gate oxide layer is larger than the dielectric constant of a lower gate oxide layer. Each TFT's are produced at the same time.

An upper gate electrode of a select TFT is used as a control gate, and an upper gate electrode of a select TFT is connected to a fixed voltage so that it does not function as a control gate. As for a bias TFT, a lower gate electrode is used as a control gate, and an upper gate electrode is fixed to a source voltage. Thus, the value S of a bias TFT is large, and the value S of a select TFT is small, and high quality image display system is obtained.

As describe above, according to the present invention, the value S of a select TFT is kept small, and the value S of only a bias TFT is large. Thus, high quality image display system is provided.

For a given size or area of a screen, the higher the resolving power is, the smaller the area of each thin film organic EL element for one pixcel is. Therefore, although the current in a TFT with large value S is small for given gate voltage which is determined by power source voltage, that current is enough for the operation of an image display system of high resolution.

Some examples for modifying the value S are to modify the thickness of a gate oxide layer, and to modify the dielectric constant of a gate oxide layer. Those modification means may be used not only by using only one of them, but also with combination.

The present invention provides high quality image display system by using a bias FET with the larger value S than that of a select FET.

It should be noted that a select FET and a bias FET are produced simultaneously, so that the producing cost of the present display system is low.

From the foregoing it will now be apparent that a new and improved image display system has been found. It should be noted of course that the embodiments disclosed are merely illustrative and are not intended to limit the scope of the invention. Reference should be made to the appended claims, therefore, for indicating the scope of the invention.

What is claimed is:

1. An image display device having a plurality of pixcels, each of which comprising;
   an organic EL element,
   a bias FET for light emission current control of said organic EL element,
   a capacitor for holding signal coupled with a gate electrode of said bias FET,
   a select FET for selectively supplying signal to said capacitor according to image data to be displayed, wherein value S of said bias FET is larger than that of said select. FET.

2. An image display device according to claim 1, wherein a gate oxide layer of said bias FET is thicker than that of said select FET.

3. An image display device according to claim 1, wherein said select FET comprises laminated structure of an upper gate electrode, an upper gate oxide layer, an active layer, a lower gate oxide layer and a lower gate electrode, and an upper gate oxide layer immediately under said upper gate electrode is thinner than a lower gate oxide layer immediately over said lower gate electrode, and
said bias FET has similar structure to that of said select FET, and a lower electrode of the same is used as a gate electrode.

4. An image display device according to claim 1, wherein said bias FET comprises laminated structure of an upper gate electrode, an upper gate oxide layer, an active layer, a lower gate oxide layer, and a lower gate electrode so that said upper gate oxide layer is thinner than said lower gate oxide layer, and
said select FET has the similar structure to that of said bias FET and is produced simultaneously with said bias FET, and said lower gate electrode is used as a gate electrode of said select FET.

5. An image display device according to claim 1, wherein said bias FET comprises laminated structure of an upper gate electrode, an upper gate oxide layer, an active layer, a lower gate oxide layer, and a lower gate electrode so that said upper gate oxide layer is thinner than said lower gate oxide layer, and said upper gate electrode is used as a gate electrode of said bias FET, and
said select FET has the similar structure to that of said bias FET and is produced simultaneously with said bias FET, and said lower gate electrode is used as a gate electrode of said select FET.

6. An image display device according to claim 1, wherein said bias FET comprises laminated structure of an upper gate electrode, an upper gate oxide layer, an active layer, a lower gate oxide layer, and a lower gate electrode so that said upper gate oxide layer is thicker than said lower gate oxide layer, and
said select FET is a TFT produced simultaneously with said bias FET, and said upper gate electrode is used as a gate electrode of said select FET.

7. An image display device according to claim 1, wherein said bias FET comprises laminated structure of an upper gate electrode, an upper gate oxide layer, an active layer, a lower gate oxide layer, and a lower gate electrode so that said upper gate oxide layer is thicker than said lower gate oxide layer, and said lower gate electrode is used as a gate electrode of said bias FET,
said select FET is a TFT produced simultaneously with said bias FET, and said upper gate electrode is used as a gate electrode of said select FET.

8. An image display device according to claim 1, wherein dielectric constant of a gate oxide layer of said bias FET is smaller than that of said select FET.

9. An image display device according to claim 1, wherein said bias FET comprises laminated structure of an upper gate electrode, an upper gate oxide layer, an active layer, a lower gate oxide layer, and a lower gate electrode so that dielectric constant of said upper gate oxide layer is smaller than that of said lower gate oxide layer, and said lower gate electrode is used as a gate electrode of said bias FET,
said select FET is a TFT produced simultaneously with said bias FET, and said upper gate electrode is used as a gate electrode of said select FET.

10. An image display device according to claim 1, wherein said bias FET comprises laminated structure of an upper gate electrode, an upper gate oxide layer, an active layer, a lower gate oxide layer, and a lower gate electrode so that dielectric constant of said upper gate oxide layer is larger than that of said lower gate oxide layer, and said upper gate electrode is used as a gate electrode of said bias FET,
said select FET is a TFT produced simultaneously with said bias FET, and said lower gate electrode is used as a gate electrode of said select FET.

* * * * *